United States Patent
King (10) Patent No.: US 11,775,064 B1
(45) Date of Patent: Oct. 3, 2023

(54) MULTIPLE-MAGNET HAND-MOUNTED POSITION-TRACKING DEVICE

(71) Applicant: Hunter Maximilian King, Palo Alto, CA (US)

(72) Inventor: Hunter Maximilian King, Palo Alto, CA (US)

( * ) Notice: Subject to any disclaimer, the term of this patent is extended or adjusted under 35 U.S.C. 154(b) by 0 days.

(21) Appl. No.: 17/877,590

(22) Filed: Jul. 29, 2022

(51) Int. Cl.
  G06F 3/01 (2006.01)
  G06F 3/0346 (2013.01)
  G02B 27/01 (2006.01)
  G01R 33/07 (2006.01)

(52) U.S. Cl.
  CPC ........... *G06F 3/014* (2013.01); *G01R 33/072* (2013.01); *G02B 27/017* (2013.01); *G06F 3/017* (2013.01); *G06F 3/0346* (2013.01)

(58) Field of Classification Search
  CPC ........ G06F 3/014; G06F 3/017; G06F 3/0346; G01R 33/072; G02B 27/017
  See application file for complete search history.

(56) References Cited

U.S. PATENT DOCUMENTS

| | | | |
|---|---|---|---|
| 7,673,916 B2 * | 3/2010 | Greenhill | B25J 15/0009 901/39 |
| 10,802,586 B1 * | 10/2020 | Zhao | G01D 5/14 |
| 11,029,757 B1 * | 6/2021 | Chen | G01B 7/004 |
| 11,169,001 B2 * | 11/2021 | Watson | G01D 5/14 |
| 2016/0246369 A1 * | 8/2016 | Osman | A63F 13/212 |
| 2017/0307891 A1 * | 10/2017 | Bucknor | G06F 1/163 |
| 2018/0196515 A1 * | 7/2018 | Appleyard | G06F 3/016 |

* cited by examiner

*Primary Examiner* — Mihir K Rayan
(74) *Attorney, Agent, or Firm* — Artegis Law Group, LLP (57) ABSTRACT

A hand-mounted position-tracking device includes a plurality of position-tracking subsystems. Each position-tracking subsystem is associated with a different digit of a hand and includes a magnet and a sensor that generates a signal based on a distance between the magnet and the sensor. Each position-tracking subsystem further includes a rotatable coupling that rotationally couples the magnet to the sensor.

6 Claims, 6 Drawing Sheets

MULTIPLE-MAGNET HAND-MOUNTED POSITION-TRACKING DEVICE

BACKGROUND

Field of the Various Embodiments

The various embodiments relate generally to virtual and augmented reality computing and motion and position tracking and, more specifically, to a multiple-magnet hand-mounted position-tracking device.

Description of the Related Art

Virtual reality (VR) involves the immersive digital simulation of real-world experiences and/or experiences in fictional or constructed environments. Applications of VR include, without limitation, gaming and other forms of digital entertainment, education, business (such as virtual meetings), and training (such as practicing fine motor skills or the use of complex physical interfaces).

Traditionally, when interacting with VR environments, users employ input devices that include analog inputs, such as joysticks, and digital inputs, such as buttons. Examples of these types of input devices include VR handsets and gaming console controllers. However, as VR applications become more sophisticated, more complex interactions with virtual objects within VR environments are necessary. In particular, more precise tracking of hand and finger motions within VR environments are required to simulate fine motor movements of a user's hands and fingers. As a general matter, the simple analog and digital inputs provided by conventional VR handsets and gaming console controllers cannot generate sufficiently precise inputs for more complex VR applications. Notably, conventional input devices are not able to capture subtle hand and finger motions of users. In an effort to address these shortcomings of conventional input devices, input devices that users wear on their hands (referred to herein as "data gloves") have been developed to more precisely track the movement and position of a user's individual fingers within a VR environment.

One current data glove design is a flex-sensor-based glove that includes an array of flex sensors for tracking the movements and positions of each finger of a user. In these types of designs, the resistance value of each flex sensor changes according to the bending of a particular joint, which allows the bent angle of that joint to be estimated. One drawback to flex-sensor designs is that these designs provide accurate tracking only when a user's hand and fingers fit snugly into the glove without stretching the glove material. Consequently, a differently sized glove is needed for almost every different user, and, even then, the related sensor readings may be somewhat inaccurate due to material stretching.

Another current data glove design forms part of an optical system in which a camera tracks visible markers on a user's hands and/or fingers. Alternatively, optical systems may serve as a substitute for data gloves, tracking ungloved hands using computer vision. One drawback of this type of design is that an optical system is unable to track positions properly when the line of sight between the camera and the glove is occluded. Occlusion causes the same problems in a system in which the vision sensor is attached to the gloves and tracks markers or lights in the environment.

Yet another current data glove design includes a magnet attached to the base of the glove and Hall-effect sensors on the fingers of the glove that enable the movements and positions of each user finger to be tracked. One drawback to these designs is that the magnet of one glove can interfere with the finger position tracking of the other glove when the user's hands are close together.

Yet another current data glove design includes one or more inertial measurement units (IMUs) for each user finger that detects the acceleration and/or rotation of the associated fingers or joints. One drawback to these designs is that each IMU is prone to drift. Therefore, frequent recalibration is required.

As the foregoing illustrates, what is needed in the art are more effective ways to generate control inputs when interacting with VR or augmented reality environments.

SUMMARY

One embodiment of the present sets forth a hand-mounted position-tracking device that includes a plurality of position-tracking subsystems, wherein each position-tracking subsystem is associated with a different digit of a hand and comprises: a magnet; and a sensor that generates a signal based on a distance between the magnet and the sensor.

At least one technical advantage of the disclosed design relative to the prior art is that the disclosed design enables occlusion-agnostic motion and position tracking of a user's fingers that is free from magnetic interference when two-handed gestures are performed. Another technical advantage of the disclosed design is that the magnet and sensor in each position-tracking subsystem have a fixed rotational relationship with one another that is not subject to drift and is able to provide accurate finger positioning even when the hand-mounted position-tracking device must stretch to fit a user's hand. These technical advantages represent one or more technological improvements over prior art designs and approaches.

BRIEF DESCRIPTIONS OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

In the following description, numerous specific details are set forth to provide a more thorough understanding of the embodiments. However, it will be apparent to one of skill in the art that the embodiments may be practiced without one or more of these specific details.

System Overview

Figure 1:
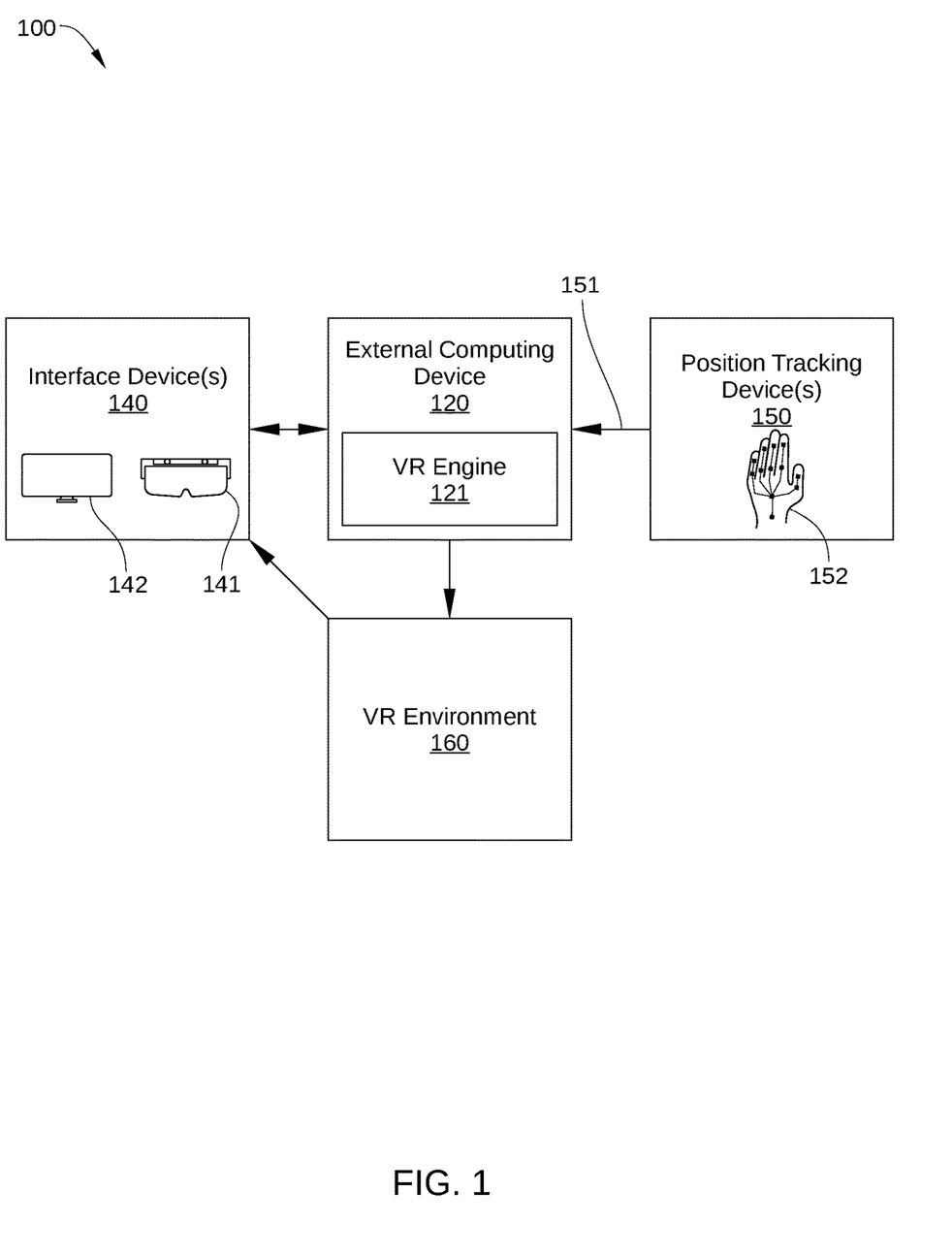
FIG. 1 illustrates a virtual reality system configured to implement one or more aspects of the various embodiments.

FIG. 1 illustrates a virtual reality (VR) system 100 configured to implement one or more aspects of the various embodiments. In the embodiment illustrated in FIG. 1, VR system 100 includes a computing device 120 running an VR engine 121, one or more interface devices 140, one or more position-tracking devices 150, and a VR environment 160 that is generated by VR engine 121. VR system 100 is configured to enable a user (not shown) to perform tasks and/or interact with virtual objects in VR environment 160. For example, using VR environment 160 and position-tracking devices 150, a user can interact with virtual objects in VR environment 160 to train for physical tasks associated with medical, military, or industrial procedures, or interact with VR-based software applications. In another example, using VR environment 160 and position-tracking devices 150, a user can experience and interact with an immersive virtual environment, such as in a VR gaming application. In the embodiments described herein, VR system 100 is configured for the generation of and interactions with a VR environment. In other embodiments, VR system 100 can be configured for the generation of and interactions with an augmented reality (AR) environment, in which AR visual elements are superimposed on a video of the actual environment the user is facing.

As shown, external computing device 120, interface devices 140, and position-tracking devices 150 are communicatively connected to each other. In some embodiments, external computing device 120, interface devices 140, and position-tracking devices 150 can be communicatively connected via any technically feasible communication network (not shown) that allows data to be exchanged between external computing device 120 and external entities or devices, such as interface devices 140, position-tracking devices 150, a web server, or another networked computing device (not shown). For example, in some embodiments the communication network includes a wide area network (WAN), a local area network (LAN), a wireless (WiFi) network, a Bluetooth network and/or the Internet, among others.

External computing device 120 is a computing device that is configured to enable various embodiments described herein. For example, external computing device 120 can be a smartphone, laptop computer, electronic tablet, wearable smart device, or other computing device that is available to a user. Alternatively, external computing device 120 can be a desktop computer that is available to the user. An example embodiment of external computing device 120 is described below in conjunction with FIG. 6. As shown, external computing device 120 runs VR engine 121, which generates VR environment 160, receives position-tracking signals 151 from position-tracking devices 150, and modifies VR environment 160 based in part on position-tracking signals 151. Position-tracking signals 151 include position, orientation, and/or gesture information or signals indicating the motion and/or relative position of the hand and/or fingers of a user wearing one or more position-tracking devices 150.

Alternatively, in some embodiments, external computing device 120 is incorporated into a data glove 152 or an interface device 140. Alternatively, in some embodiments, external computing device 120 is configured as a separate device from data glove 152.

Interface devices 140 are configured to present VR environment 160 to a user. In the embodiment illustrated in FIG. 1, interface devices include at least one of a VR headset 141 and/or a display 142. VR headset 141 can be configured to display a VR and/or an augmented reality (AR) environment, such as VR environment 160. Thus, in some embodiments, VR headset 141 is configured as an AR-only device, in some embodiments, VR headset 141 is configured as a VR-only device, and in some embodiments, VR headset 141 is configured to be selectively operated as either an AR device or a VR device. When a user wears VR headset 141 and VR headset 141 generates an AR environment, VR headset 141 displays AR visual elements that are superimposed on a video of the actual environment the user is facing. When a user wears VR headset 141 and VR headset 141 generates a VR environment, VR headset 141 displays VR visual elements that are incorporated into the VR environment being presented to the user.

Position-tracking devices 150 are devices that enable a user to interact with portions of VR environment 160, such as virtual objects. For example, in some embodiments, position-tracking devices 150 include one or more data gloves 152 that are worn by a user. Each data glove 152 is a hand-mounted position-tracking device. In such embodiments, position-tracking signals 151 of data glove 152 and/or of the fingers and hands of data glove 152 are provided to VR engine 121. VR engine 121 incorporates such position, orientation, and/or gesture information into VR environment 160. Consequently, in such embodiments, data glove 152 or a virtual avatar of the user's hand wearing data glove 152 can be included in VR environment 160, and can be shown interacting with virtual objects in VR environment. Thus, a user wearing data glove 152 can make selections and/or operate virtual input devices present in VR environment 160 that enable control signals to be generated or other interactions to be performed by a user. An embodiment of data glove 152 is described below in conjunction with FIG. 2.

Data Glove with Multiple Position-Tracking Subsystems

Figure 2:
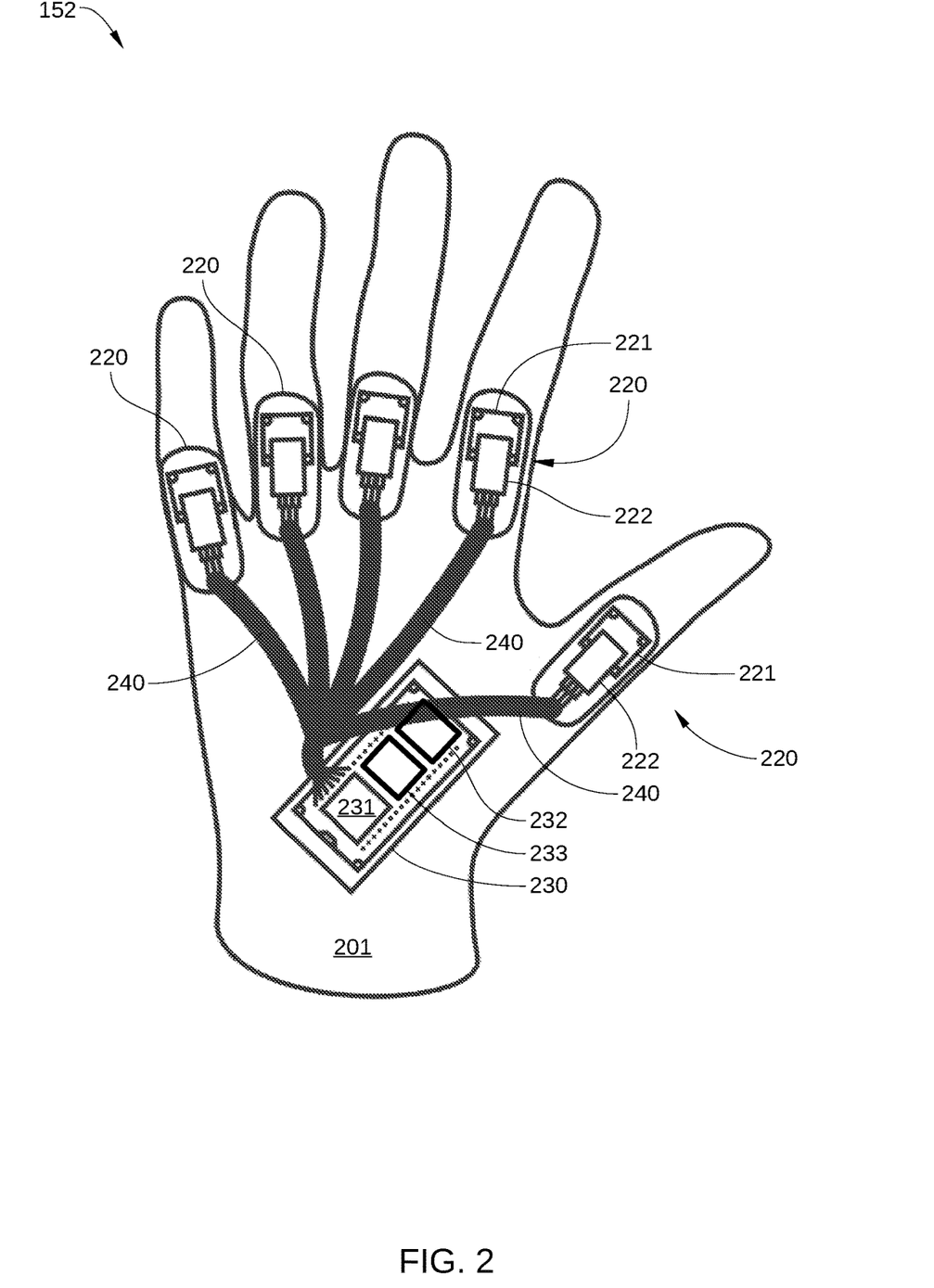
FIG. 2 is a more detailed illustration of the data glove of FIG. 1, according to various embodiments.

FIG. 2 is a more detailed illustration of a data glove 152, according to various embodiments. Data glove 152 is configured as a user input device for user interactions with VR environment 160. Specifically, data glove 152 allows a user to interact with virtual objects naturally using finger motions as inputs. For example, while wearing data gloves 152, the user can press virtual buttons, clap in a VR concert, or perform any number of inputs through physical motion of the hand and fingers. As shown, data glove 152 includes a glove-shaped body 201, a plurality of position-tracking subsystems 220, and a controller assembly 230. In the embodiment illustrated in FIG. 2, position-tracking subsystems 220 are communicatively coupled to controller assembly 230 via flexible conductors 240.

Glove-shaped body 201 enables a user to wear data glove 152 on the hand and fingers and thereby employ data glove 152 while the user experiences and/or interacts with a VR environment, such as VR environment 160. As shown, position-tracking subsystems 220 and controller assembly 230 are mounted on glove-shaped body 201. In some embodiments, glove-shaped body 201 includes a stretchable material that can expand or contract to accommodate a wide variety of hand sizes while providing a snug fit. According to various embodiments, and as described in greater detail below, the accuracy of position-tracking signals 151 is not adversely affected by different-sized user hands and fingers when position-tracking subsystems 220 are positioned properly on a hand of a user. Thus, a large number of data gloves 152 of various sizes are not needed to enable users with differently sized hands to all use VR system 100 of FIG. 1.

Each position-tracking subsystem 220 includes a magnet 221 and a corresponding sensor 222, and is configured to generate a position-tracking signal associated with a particular digit of a user's hand. The magnet 221 and sensor 222 for a particular position-tracking subsystem 220 are mechanically coupled to each other via a rotatable coupling 323, such as a hinge or a patch of non-stretch fabric that can be bent. For example, in some embodiments, a base 224 of magnet 221 is mounted on one side of rotatable coupling 323 and sensor 222 is mounted on the other side of rotatable coupling 323. One such embodiment is described below in conjunction with FIG. 3.

Figure 3:
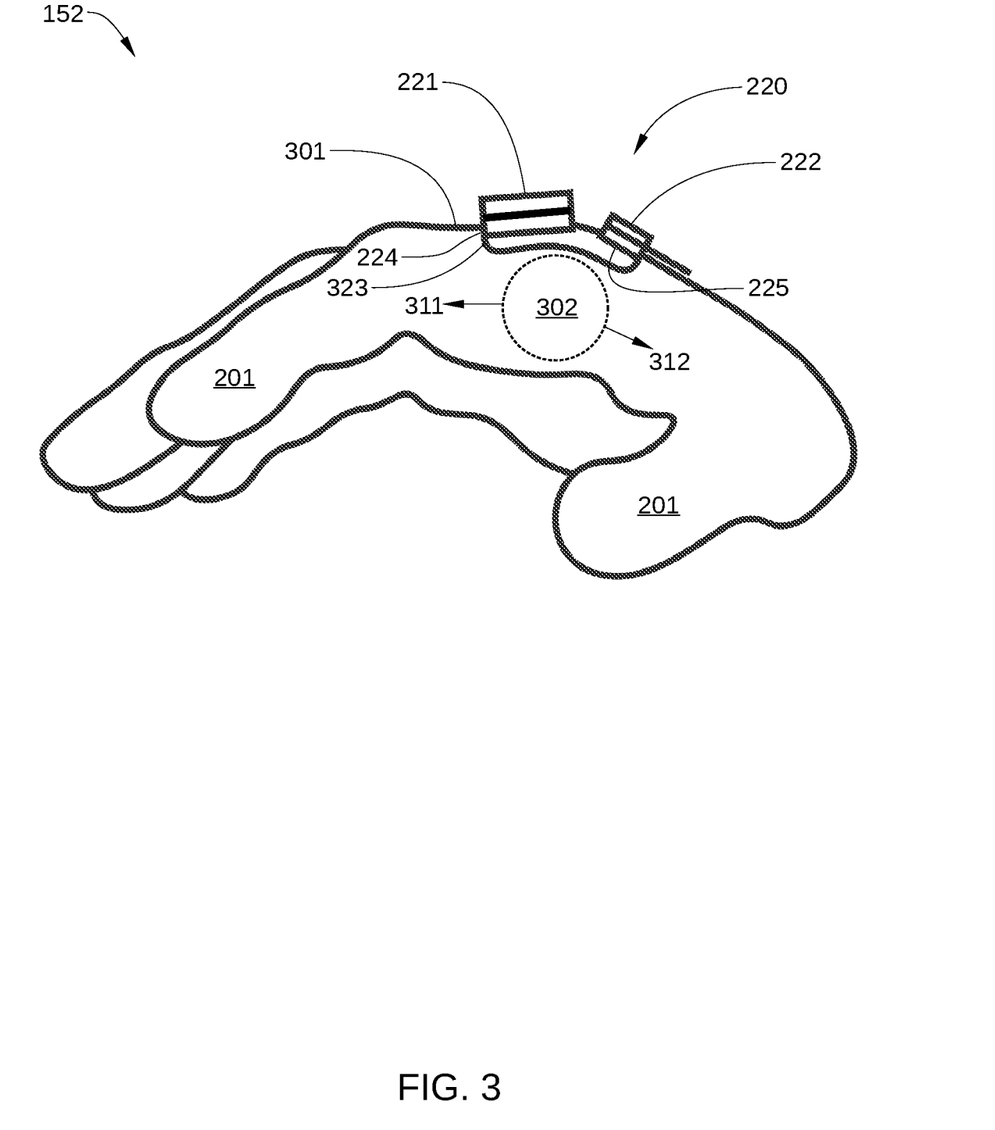
FIG. 3 is a more detailed illustration of the position-tracking subsystem of FIG. 2, according to various embodiments.

FIG. 3 is a more detailed illustration of position-tracking subsystem 220, according to various embodiments. As shown, position-tracking subsystem 220 is mounted on a surface 301 of glove-shaped body 201 in a location that corresponds to a digit joint 302 of a user's hand when the user wears data glove 152. In addition, position-tracking subsystem 220 is located on surface 301 so that rotatable coupling 323 spans digit joint 302. Thus, in the embodiment illustrated in FIG. 3, rotatable coupling 323 is positioned such that magnet 221 is coupled to a location on surface 301 that corresponds to a first side 311 of digit joint 302 and sensor 222 is coupled to a location on surface 301 that corresponds to a second side 312 of digit joint 302.

Magnet 221 can be any technically feasible source of a magnetic field, such as a permanent magnet or an electromagnet. In a preferred embodiment, to reduce power consumption of data glove 152, magnet 221 includes a permanent magnet. Sensor 222 can be any technically feasible sensor that generates a signal based on a strength of a magnetic field, such as a Hall-effect sensor and the like. As noted above, magnet 221 and sensor 222 are each mounted on rotatable coupling 323. In the embodiment illustrated in FIG. 3, magnet 221 is coupled to rotatable coupling 323 via base 224 and sensor 222 is coupled to rotatable coupling 323 via a base 225. For example, in some embodiments, magnet 221 is coupled to a surface of base 224 with an adhesive and base 224 is sewn or otherwise fixed to surface 301 of glove-shaped body 201. Similarly, in some embodiments, sensor 222 is coupled to a surface of base 225 with an adhesive and base 225 is sewn or otherwise fixed to surface 301 of glove-shaped body 201.

Rotatable coupling 323 constrains relative motion between magnet 221 and sensor 222 to rotation about a single axis of rotation. In some embodiments, rotatable coupling 323 includes a mechanical hinge mechanism that allows a single degree of freedom of motion (rotation) between magnet 221 and sensor 222. Thus, when digit joint 302 bends and rotatable coupling 323 is rotationally actuated, the motion in three-dimensional space of magnet 221 relative to sensor 222 can be determined based on the distance between magnet 221 and sensor 222. In such embodiments, when a user bends digit joint 302, the signal generated by sensor 222 that indicates the distance between magnet 221 and sensor 222 can be used to determine the angle of actuation of digit joint 302.

In alternative embodiments, rotatable coupling 323 can be any technically feasible mechanism on which magnet 221 and sensor 222 can be mounted that substantially or entirely restricts the relative motion between magnet 221 and sensor 222 to rotation about a single axis of rotation. For example, in some embodiments, rotatable coupling 323 can include a non-stretch but flexible fabric that can bend when digit joint 302 bends, but otherwise maintains the same physical relationship between magnet 221 and sensor 222. In one such embodiment, the non-stretch fabric is reinforced to prevent being twisted or otherwise distorted in other directions beside rotation when digit joint 302 bends.

In the embodiment illustrated in FIG. 2, a single position-tracking subsystem 220 is attached to a different finger of glove-shaped body 201, and therefore, when data glove 152 is worn on the hand of a user, each position-tracking subsystem 220 is associated with a different digit of the user's hand. In other embodiments, multiple position-tracking subsystems 220 are attached to the same finger of glove-shaped body 201. In such embodiments, when data glove 152 is worn on the hand of a user, multiple position-tracking subsystems 220 are associated with a single digit of the user's hand. In such embodiments, the multiple position-tracking subsystems 220 that are associated with a particular digit of the user's hand can each be associated with a different digit joint of that particular digit. As a result, in such embodiments, the position and/or orientation of each joint of a user digit can be determined in real time, thereby enabling the translation of fine motor movements of a user's fingers to a VR environment, including the bending of each individual joint of each user digit.

Controller assembly 230 is configured to receive signals from position-tracking subsystems 220 and provide position-tracking signals 151 to external computing device 120. For example, in some embodiments, controller assembly 230 receives signals from position-tracking subsystems 220 and provides power and ground to position-tracking subsystems 220 via flexible conductors 240 and pins included in a printed circuit board (PCB). In the embodiment illustrated in FIG. 2, controller assembly 230 includes a controller chip 231 (e.g., an Arduino board or PCB-mounted microprocessor), a power source 232, and a communications module 233, which may be mounted on a PCB that is part of position-tracking subsystem 220.

Power source 232 can include a battery. Alternatively or additionally, in some embodiments, power source 232 can include a suitable power supply that is electrically coupled to a power source external to data glove 152. Communications module 233 communicatively connects position-tracking subsystem 220 to external computing device 120, for example via a wireless connection and/or via a wired connection. In some embodiments, the wireless connection includes a Bluetooth serial connection, a Bluetooth low energy connection, a Wi-Fi connection, and/or the like. In some embodiments, the wired connection includes a USB serial connection.

In some embodiments, controller chip 231 generates position-tracking signals 151 based on the signals received from position-tracking subsystems 220. For example, in some embodiments, controller chip 231 performs scaling and mapping operations on the signals received from position-tracking subsystems 220 to generate position-tracking signals 151. In such embodiments, the output range of each particular position-tracking subsystem 220 is mapped to the full range of outputs that can be received by a driver or other component of VR engine 121 (shown in FIG. 1). For example, in some embodiments, the full range of flexion to extension of a particular digit joint is mapped to the full range of accepted values (e.g., 0 steps to 4095 steps) that can be received by VR engine 121 for the position of that particular digit joint. Thus, in such an embodiment, the changes in position associated with extension and flexion of that joint is distributed over the full range of values accepted by VR engine 121, thereby maximizing or otherwise enhancing the precision and accuracy of position-tracking signals 151 provided to VR engine 121. It is noted that in such embodiments, position-tracking signals 151 are generated using a process that is computationally much less complex than the algorithms associated with conventional data gloves, such as data gloves that include inertial measurement units (IMUs) and/or computer vision to detect the position of a user's hand or finger. Because in each position-tracking subsystems 220 a rotatable coupling 323 constrains relative motion between a magnet 221 and a sensor 222 to rotation about a single axis of rotation, the position of magnet 221 in three-dimensional space relative to sensor 222 is a simple function of the distance between magnet 221 and sensor 222. Generally, the function is a quadratic function, since the magnetic field strength of a magnetic field generally changes proportional to the square of the distance from the center of the magnetic field.

It is noted that because each position-tracking subsystem 220 includes a magnet 221 that is located relatively close to a sensor 222. As a result, magnet 221 can be a relatively weak magnet that is unlikely to interfere with magnets 221 included on a different data glove 152. As a result, two-handed gestures can be performed using data glove 152 without the risk of interference from a magnet 221 associated with one user hand producing a signal in a sensor 222 of another user hand.

In some embodiments, controller chip 231 is configured to remap the range of signals received from a position-tracking subsystem 220 during operation of data glove 152. One such embodiment is described below in conjunction with FIG. 4.

Figure 4:
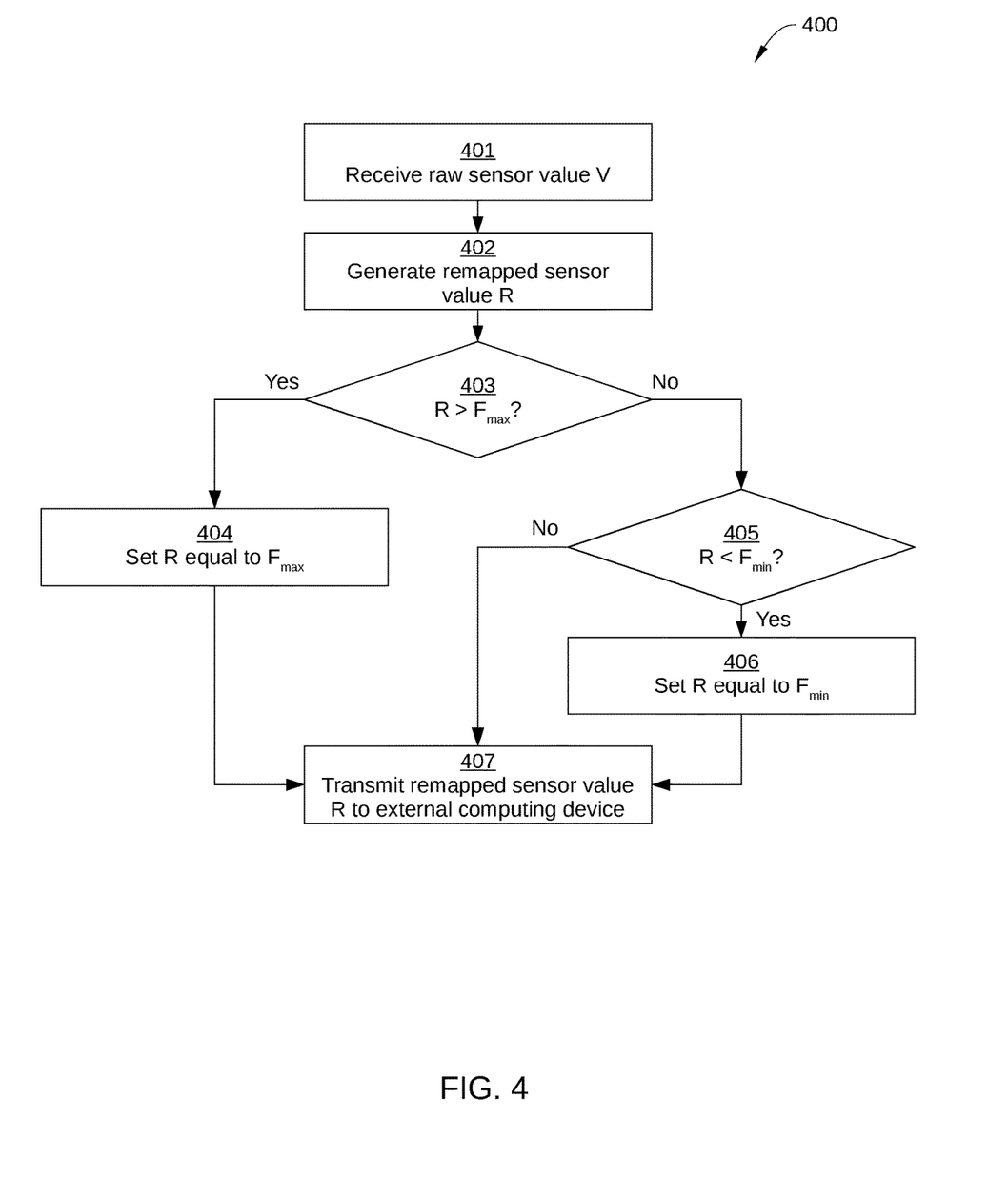
FIG. 4 sets forth a flowchart of method steps for remapping signals received from a hand-mounted position-tracking device, according to various embodiments.

FIG. 4 sets forth a flowchart of method steps for generating position-tracking signals, according to various embodiments. Although the method steps are described in conjunction with the systems of FIGS. 1-3, persons skilled in the art will understand that any system configured to perform the method steps, in any order, is within the scope of the embodiments. In some embodiments, the method steps are performed during normal operation of data glove 152.

As shown, a computer-implemented method 400 begins at step 401, where controller chip 231 receives a raw sensor value (V) from a particular position-tracking subsystem 220. In step 402, controller chip 231 remaps raw sensor value V to fit a range of values (such as a driver domain) associated with VR engine 121 by generating a remapped sensor value R. In some embodiments, controller chip 231 generates remapped value R based on values associated with the particular position-tracking subsystem 220. For example, in some embodiments, remapped value R is based on the raw sensor value V for the particular position-tracking subsystem 220, a final range minimum $F_{min}$ for the particular position-tracking subsystem 220, a final range maximum Fmax for the particular position-tracking subsystem 220, a starting range minimum $S_{min}$ for the particular position-tracking subsystem 220, and a starting range maximum $S_{max}$ for the particular position-tracking subsystem 220. In one such embodiment, remapped sensor value R is generated using the equation:

$$R = F_{min} + \frac{(V - S_{min})(F_{max} - F_{min})}{(S_{max} - S_{min})}.$$

In step 403, controller chip 231 determines whether remapped value R is greater than final range maximum Fmax. When remapped sensor value R is greater than final range maximum Fmax, computer-implemented method 400 proceeds to step 404; when remapped sensor value R is less than or equal to final range maximum Fmax, computer-implemented method 400 proceeds to step 405.

In step 404 controller chip 231 sets remapped sensor value R to final range maximum Fmax. In step 405, controller chip 231 determine whether remapped value R is less than final range minimum $F_{min}$. When remapped sensor value R is less than final range minimum $F_{min}$, computer-implemented method 400 proceeds to step 406; when remapped sensor value R is greater than or equal to final range minimum $F_{min}$, computer-implemented method 400 proceeds to step 407. In step 406, controller chip 231 sets remapped sensor value R to final range minimum $F_{min}$ and computer-implemented method 400 proceeds to step 407.

In step 407, controller chip transmits remapped sensor value R to external computing device 120, for example via a Bluetooth serial connection, a Bluetooth low energy connection, a USB serial connection, and/or a Wi-Fi connection. External computing device 120 generates joint rotations based on the remapped sensor values R associated with each position-tracking subsystem 220. In some embodiments, external computing device 120 provides the generated joint rotations to VR engine 121. In such embodiments, VR engine 121 is configured to determine resultant hand and finger positions in three-dimensional space based on the generated joint rotations. In other embodiments, external computing device 120 further processes the generated joint rotations by applying such joint rotations to a hand model, such as a hand model that is positioned in three-dimensional space by an external tracker of a user's hand. In such embodiments, external computing device 120 then provides hand and finger positions in three-dimensional space to VR engine 121.

In some embodiments, calibrations can be performed to fine-tune the performance of data glove 152. For example, in some embodiments, for some or all of position-tracking subsystems 220 included in a data glove 152, values associated with remapping raw sensor value V to a remapped value R can be determined periodically. For example, in such embodiments, values associated with remapping raw sensor value V to remapped value R can be determined in response to powering up, and/or in response to a user donning the data glove 152. In such embodiments, for each position-tracking subsystem 220, new values for final range minimum $F_{min}$, final range maximum Fmax, starting range minimum $S_{min}$, and starting range maximum $S_{max}$ can be determined.

Finger-Splay Sensor

In some embodiment, one or more position-tracking subsystems of a data glove include a finger splay sensor. In such embodiments, finger splay for some or all digits of a user's hand can be determined. By including detection of finger splay, which is the side-to-side motion of a digit or divergence of one digit from another, more fine motor movements of a user's fingers can be incorporated in interactions with a VR environment. One such embodiment is described below in conjunction with FIG. 5.

Figure 5:
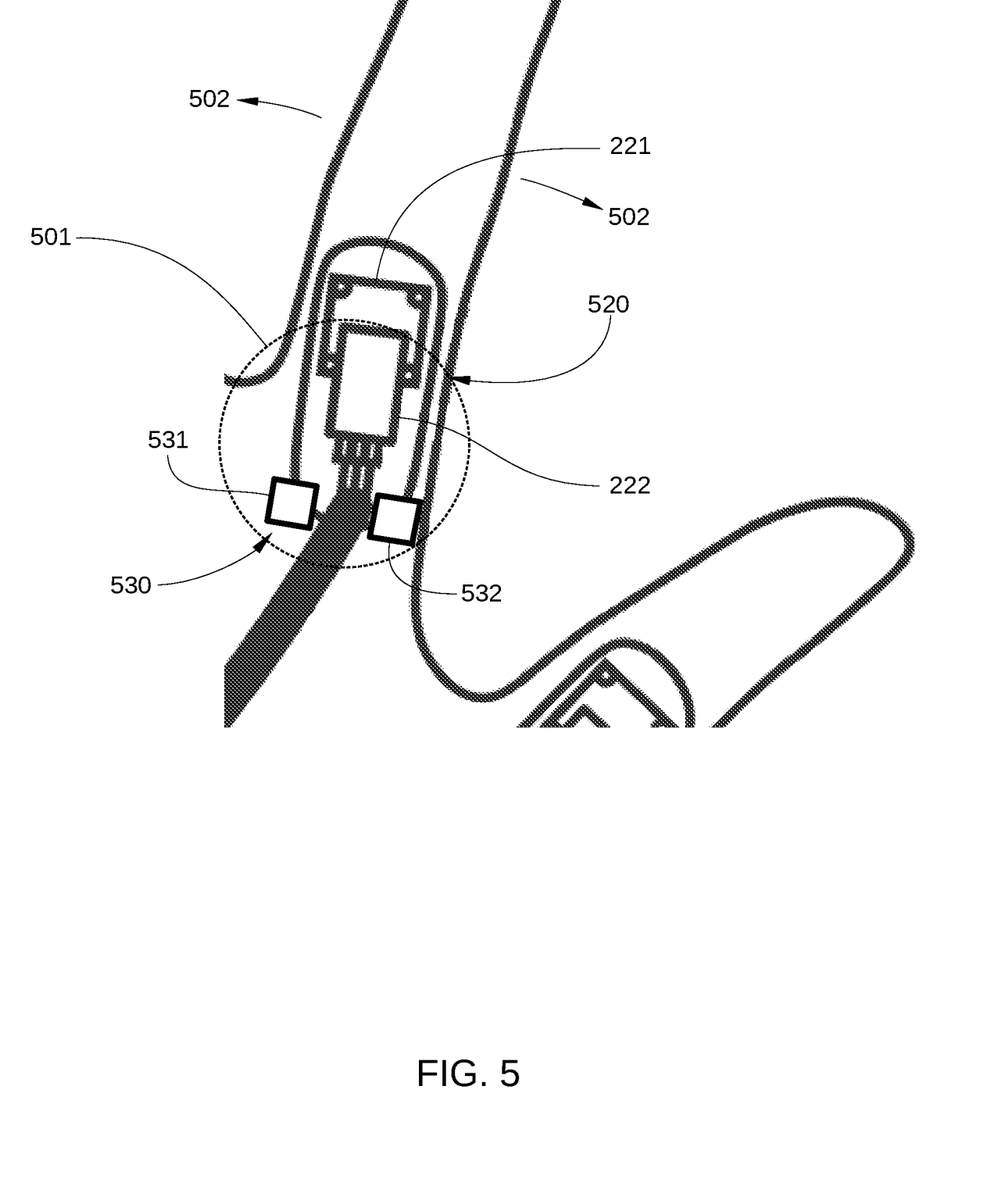
FIG. 5 is a more detailed illustration of the position-tracking subsystem of FIG. 2, according to various other embodiments.

FIG. 5 is a more detailed illustration of a position-tracking subsystem 520, according to various embodiments. As shown, position-tracking subsystem 520 includes magnet 221 and sensor 222 for detecting flexion and extension of a particular digit joint 501. In addition, position-tracking subsystem 520 includes a finger-splay sensor 530. In the embodiment illustrated in FIG. 5, finger-splay sensor 530 is disposed on the hand side of digit joint 501, and is configured to detect a side-to-side splaying motion 502 of the digit associated with position-tracking subsystem 520, where splaying motion 502 generally originates from digit joint 501. In some embodiments, finger-splay sensor 530 includes a first sensor 531 and a second sensor 532. In such embodiments, when a data glove that includes position-tracking subsystem 520 is worn on the hand of a user, first sensor 531 is disposed on a first side of digit joint 501 and the associated digit, while second sensor 532 is disposed on a second side of digit joint 501 and the associated digit. In such embodiments, splaying motion 502 is determined based on the different signals detected by first sensor 531 and second sensor 532 as magnet 221 in moved by splaying motion 502. Alternatively or additionally, in some embodiments, finger-splay sensor 530 includes a rotary potentiometer. In such embodiments, splaying motion 502 can be detected by rotation of the rotary potentiometer.

Exemplary External Computing Device

Figure 6:
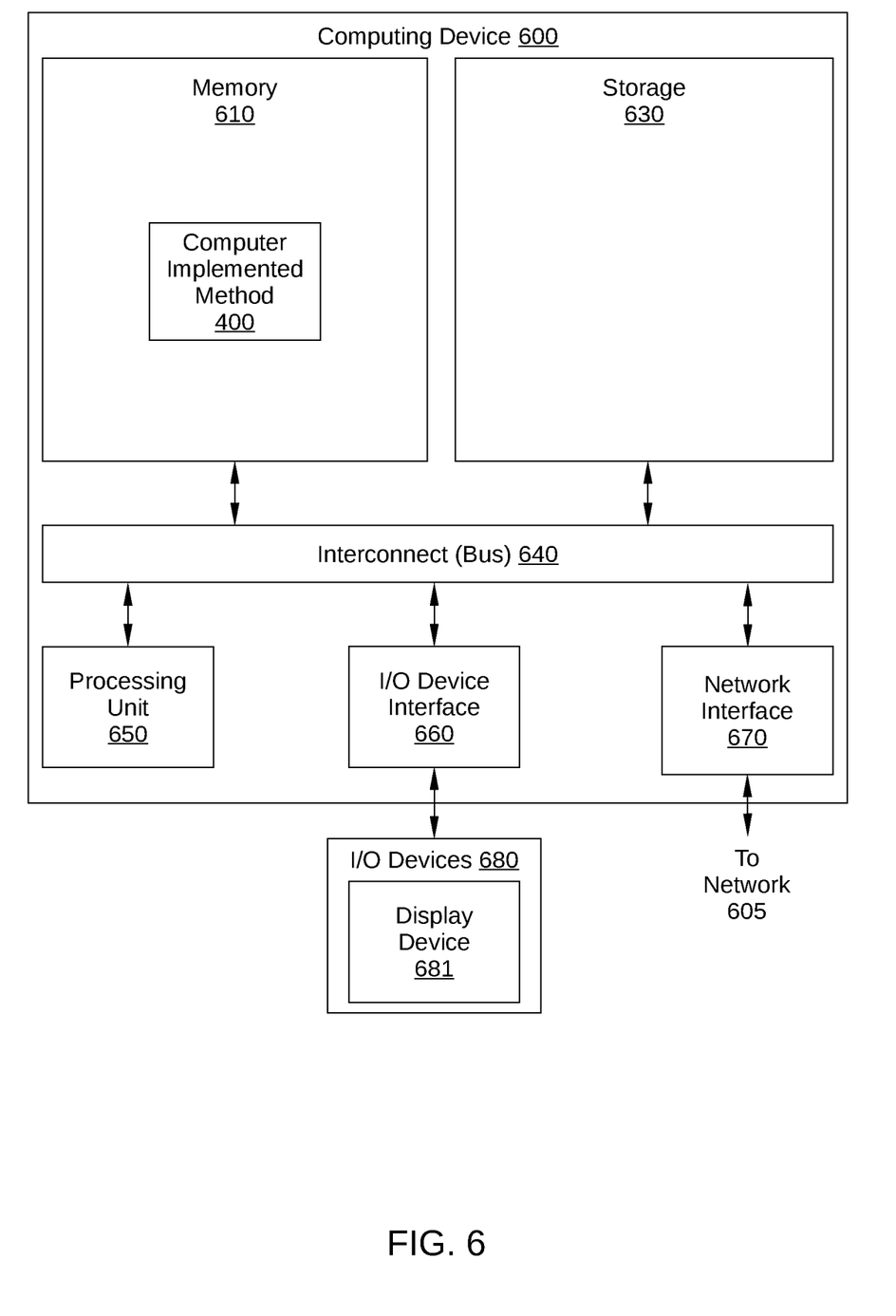
FIG. 6 is a block diagram of a computing device configured to implement one or more aspects of the various embodiments.

FIG. 6 is a block diagram of a computing device 600 configured to implement one or more aspects of the various embodiments. Thus, computing device 600 can be a computing device associated with external computing device 120, interface devices 140, and/or interaction devices 150. Computing device 600 may be a desktop computer, a laptop computer, a tablet computer, a computer integrated into a VR headset, or any other type of computing device configured to receive input, process data, generate control signals, and display images. Computing device 600 is configured to run computer-implemented method 400, and/or other suitable software applications, which can reside in a memory 610. It is noted that the computing device described herein is illustrative and that any other technically feasible configurations fall within the scope of the present disclosure.

As shown, computing device 600 includes, without limitation, an interconnect (bus) 640 that connects a processing unit 650, an input/output (I/O) device interface 660 coupled to input/output (I/O) devices 680, memory 610, a storage 630, and a network interface 670. Processing unit 650 may be any suitable processor implemented as a central processing unit (CPU), a graphics processing unit (GPU), an application-specific integrated circuit (ASIC), a field programmable gate array (FPGA), any other type of processing unit, or a combination of different processing units, such as a CPU configured to operate in conjunction with a GPU. In general, processing unit 650 may be any technically feasible hardware unit capable of processing data and/or executing software applications, including computer-implemented method 400. Further, in the context of this disclosure, the computing elements shown in computing device 600 may correspond to a physical computing system (e.g., a system in a data center) or may be a virtual computing instance executing within a computing cloud.

I/O devices 680 may include devices capable of providing input, such as a keyboard, a mouse, a touch-sensitive screen, and so forth, as well as devices capable of providing output, such as a display device 681. Additionally, I/O devices 680 may include devices capable of both receiving input and providing output, such as a touchscreen, a universal serial bus (USB) port, and so forth. I/O devices 680 may be configured to receive various types of input from an end-user of computing device 600, and to also provide various types of output to the end-user of computing device 600, such as one or more graphical user interfaces (GUI), displayed digital images, and/or digital videos. In some embodiments, one or more of I/O devices 680 are configured to couple computing device 600 to a network 605.

Memory 610 may include a random access memory (RAM) module, a flash memory unit, or any other type of memory unit or combination thereof. Processing unit 650, I/O device interface 660, and network interface 670 are configured to read data from and write data to memory 610. Memory 610 includes various software programs that can be executed by processor 650 and application data associated with said software programs, including computer-implemented method 400.

In sum, the various embodiments shown and provided herein set forth a hand-mounted position-tracking device that includes a plurality of position-tracking subsystems. Each position-tracking subsystem includes a magnet and a sensor, and provides an easily scalable output signal that indicates a rotational orientation of a specific digit joint of a user's hand. In some embodiments, the magnet and sensor are coupled to each other by a rotatable coupling that substantially or entirely restricts the relative motion between the magnet and the sensor to rotation about a single axis of rotation. In such embodiments, the rotational orientation of the specific digit joint can be determined based on a distance between the magnet and the sensor.

At least one technical advantage of the disclosed design relative to the prior art is that the disclosed design enables occlusion-agnostic motion and position tracking of a user's hand and fingers that is free from magnetic interference when two-handed gestures are performed. Another technical advantage of the disclosed design is that the magnet and sensor in each position-tracking subsystem have a fixed rotational relationship with one another that is not subject to drift and is able to provide accurate hand and finger positioning independently of how snugly the hand-mounted position-tracking device fits a user's hand. These technical advantages represent one or more technological improvements over prior art designs and approaches.

1. In some embodiments, a hand-mounted position-tracking device comprises: a plurality of position-tracking subsystems, wherein each position-tracking subsystem is associated with a digit of a hand, and wherein each position-tracking subsystem includes: a magnet, and a sensor that generates a signal based on a distance between the magnet and the sensor.
2. The hand-mounted position-tracking device of clause 1, wherein each position-tracking subsystem associated with a given digit is further associated with a different joint of the given digit.
3. The hand-mounted position-tracking device of clauses 1 or 2, wherein, when the hand-mounted position-tracking device is worn on the hand, the magnet is disposed on a first side of the digit joint and the sensor is disposed on a second side of the digit joint.

4. The hand-mounted position-tracking device of any of clauses 1-3, wherein the signal indicates an angle of displacement associated with a joint of a given digit.
5. The hand-mounted position-tracking device of any of clauses 1-4, wherein each position-tracking subsystem further includes a rotatable coupling that rotationally couples the magnet to the sensor.
6. The hand-mounted position-tracking device of any of clauses 1-5, wherein an angular displacement of the rotatable coupling corresponds to an angular displacement associated with a joint of a given digit.
7. The hand-mounted position-tracking device of any of clauses 1-6, wherein the rotatable coupling comprises one of a hinge or a patch of non-stretchable fabric.
8. The hand-mounted position-tracking device of any of clauses 1-7, wherein each position-tracking subsystem further includes a finger-splay sensor that generates a finger-splaying signal associated with a particular digit of the hand.
9. The hand-mounted position-tracking device of any of clauses 1-8, wherein the finger-splay sensor includes a rotary potentiometer.
10. The hand-mounted position-tracking device of any of clauses 1-9, wherein: the finger-splay sensor included in each position-tracking subsystem includes a first sensor and a second sensor, and when the hand-mounted position-tracking device is worn on the hand, the first sensor is disposed on a first side of a digit of the hand and the second sensor is disposed on a second side of the digit of the hand.
11. The hand-mounted position-tracking device of any of clauses 1-10, wherein the magnet is mounted on a first base that is coupled to a first side of a rotatable coupling, and the sensor is mounted on a second base that is coupled to a second side of the rotatable coupling.
12. The hand-mounted position-tracking device of any of clauses 1-11, wherein the rotatable coupling is attached to a surface of a glove-shaped body component of the hand-mounted position-tracking device.
13. The hand-mounted position-tracking device of any of clauses 1-12, further comprising a controller that receives the signal generated by the sensor, and remaps a value associated with the signal to a value included within a range of values associated with a virtual reality or augmented reality environment.
14. In some embodiments, a computer-implemented method of generating position-tracking signals for a hand-mounted position-tracking device comprises: receiving a first raw sensor value from the hand-mounted position-tracking device based on a first magnet and a first sensor and a second raw sensor value from the hand-mounted position-tracking device based on a second magnet and a second sensor; generating a first remapped sensor value based on the first raw sensor value and a second remapped sensor value based on the second raw sensor value; and transmitting the first remapped sensor value and the second remapped sensor value to a computing device that is external to the hand-mounted position-tracking device.
15. The computer-implemented method of clause 14, wherein generating the first remapped sensor value comprises scaling the first raw sensor value based on a starting range maximum value for a position-tracking subsystem that includes the first magnet and the first sensor and a starting range minimum value for the position-tracking subsystem.
16. The computer-implemented method of clauses 14 or 15, further comprising, determining that the first remapped sensor value exceeds a threshold maximum range value for a position-tracking subsystem that includes the first magnet and the first sensor; and prior to transmitting the first remapped sensor value, setting the first remapped sensor value equal to the threshold maximum range value.
17. The computer-implemented method of any of clauses 14-16, further comprising, determining that the first remapped sensor value is less than a threshold minimum range value for a position-tracking subsystem that includes the first magnet and the first sensor; and prior to transmitting the first remapped sensor value, setting the first remapped sensor value equal to the threshold minimum range value.
18. The computer-implemented method of any of clauses 14-17, wherein the external computing device generates one of a virtual reality or augmented reality environment.
19. The computer-implemented method of any of clauses 14-18, wherein the external computing device modifies a virtual reality or augmented reality environment based on the first remapped sensor value and the second remapped sensor value.
20. In some embodiments, a virtual reality system comprises: a computing device for generating one of a virtual reality or an augmented reality environment; and a hand-mounted position-tracking device that includes: a plurality of position-tracking subsystems, wherein each position-tracking subsystem is associated with a digit of a hand, wherein each position-tracking subsystem includes: a magnet, and a sensor that generates a sensor signal based on a distance between the magnet and the sensor, and wherein, for each position-tracking subsystem, the hand-mounted position-tracking device transmits to the computing device a position-tracking signal based on the sensor signal.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method of generating position-tracking signals for a hand-mounted position-tracking device, the method comprising:
   receiving a first raw sensor value from the hand-mounted position-tracking device based on a first magnet and a first sensor and a second raw sensor value from the hand-mounted position-tracking device based on a second magnet and a second sensor;
   generating a first remapped sensor value based on the first raw sensor value and a second remapped sensor value based on the second raw sensor value, wherein generating the first remapped sensor value comprises scaling the first raw sensor value based on a starting range maximum value for a position-tracking subsystem that includes the first magnet and the first sensor and a starting range minimum value for the position-tracking subsystem; and
   transmitting the first remapped sensor value and the second remapped sensor value to a computing device that is external to the hand-mounted position-tracking device.

2. The computer-implemented method of claim 1, further comprising,
   determining that the first remapped sensor value exceeds a threshold maximum range value for a position-tracking subsystem that includes the first magnet and the first sensor; and
   prior to transmitting the first remapped sensor value, setting the first remapped sensor value equal to the threshold maximum range value.

3. The computer-implemented method of claim 1, further comprising,
   determining that the first remapped sensor value is less than a threshold minimum range value for a position-tracking subsystem that includes the first magnet and the first sensor; and
   prior to transmitting the first remapped sensor value, setting the first remapped sensor value equal to the threshold minimum range value.

4. The computer-implemented method of claim 1, wherein the external computing device generates one of a virtual reality or augmented reality environment.

5. The computer-implemented method of claim 1, wherein the external computing device modifies a virtual reality or augmented reality environment based on the first remapped sensor value and the second remapped sensor value.

6. A virtual reality system, comprising:
   a computing device for generating one of a virtual reality or an augmented reality environment; and
   a hand-mounted position-tracking device that includes:
   a plurality of position-tracking subsystems,
   wherein each position-tracking subsystem is associated with a digit of a hand,
   wherein each position-tracking subsystem includes:
      a magnet, and
      a sensor that generates a sensor signal based on a distance between the magnet and the sensor, wherein the sensor signal is used to determine angle of displacement associated with a joint of the digit that the position-tracking subsystem is associated with, and
   wherein, for each position-tracking subsystem, the hand-mounted position-tracking device transmits to the computing device a position-tracking signal based on the sensor signal.

* * * * *